(12) United States Patent
Jian et al.

(10) Patent No.: US 8,058,363 B2
(45) Date of Patent: Nov. 15, 2011

(54) VARNISH AND PREPREG, AND SUBSTRATES THEREOF

(75) Inventors: Bin Jian, Taoyuan (TW); Li-Chun Chen, Taoyuan (TW)

(73) Assignee: ITEQ Corporation, Taoyuan (TW)

( * ) Notice: Subject to any disclaimer, the term of this patent is extended or adjusted under 35 U.S.C. 154(b) by 460 days.

(21) Appl. No.: 12/385,465

(22) Filed: Apr. 9, 2009

(65) Prior Publication Data
US 2010/0258339 A1    Oct. 14, 2010

(51) Int. Cl.
*C08L 63/00* (2006.01)
(52) U.S. Cl. ........................................... 525/523
(58) Field of Classification Search .................. 525/523
See application file for complete search history.

(56) References Cited

U.S. PATENT DOCUMENTS

| | | | |
|---|---|---|---|
| 2007/0219295 A1* | 9/2007 | Levchik et al. | 523/451 |
| 2008/0045673 A1* | 2/2008 | Piotrowski et al. | 525/538 |
| 2008/0057314 A1* | 3/2008 | Levchik et al. | 428/413 |
| 2009/0082494 A1* | 3/2009 | Kaprinidis | 524/101 |
| 2011/0201724 A1* | 8/2011 | Levchik et al. | 523/400 |

FOREIGN PATENT DOCUMENTS

| | | |
|---|---|---|
| TW | 293831 | 12/1996 |
| TW | 583258 | 4/2004 |

* cited by examiner

*Primary Examiner* — Mark Eashoo
*Assistant Examiner* — Megan McCulley
(74) *Attorney, Agent, or Firm* — Rosenberg, Klein & Lee

(57) ABSTRACT

A varnish includes resin and composite curing agent. The composite curing agent includes curing agent of polyphenylene methylphosphonate resin and curing agent of phenol resin. Glass fabric cloth is dipped into the varnish so as to form a prepreg with better thermal stability, anti-flammability, and low absorbent ability. Furthermore, the composite curing agent can be provided for higher curing rate.

16 Claims, No Drawings

VARNISH AND PREPREG, AND SUBSTRATES THEREOF

BACKGROUND OF THE INVENTION

1. Field of the Invention

The present invention relates to a varnish and a prepreg, in particular to a halogen-free varnish with composite curing agent, a prepreg made out of the varnish, and a substrate made out of the prepreg.

2. Description of Related Art

Printed circuit board (PCB) is widely used in many applications and fields, for example, electronic devices of electronic products are inserted on PCBs. Now, PCBs are increasingly applied to high power and high thermal environment. Therefore, study and research on heat-dissipation are developed in order to improve the heat-dissipation efficiency of PCBs.

PCB is made by pressing the prepregs, copper clad laminate (CCL), or copper film. The prepregs are made by dipping glass fabrics into varnish and then curing the fabrics to form thin prepregs.

Regarding environmental protection, halogen-free PCB is more and more developed for electronic application. Phosphor is usually added into the halogen-free PCB for compensating the anti-flammability of the PCB. Traditionally, the varnish can contain either primary resin with phosphor or curing agent with phosphor. Alternatively, a phosphoric compound may be added into the varnish for improving the anti-flammability of the PCB.

The traditional varnish contain phenolic epoxy resin as the primary resin, phenol resin as the curing agent, and phosphoric compound so as to manufacture a prepreg with anti-flammability. Patent NO. TW 293831 and Patent NO. TW 583258 discloses a composite curing agent mixing the phenol resin with benzoxazine (Bz) ring along with another curing agent of phenolic resin. However, the Bz resin can lower the moisture absorption and has a low dielectric property, but the toughness of the prepreg is low. Moreover, the heatproof property is lowered in the case of the over-addition of the Bz resin. In addition, the prepreg has low reactivity for the lamination process of the FP4 substrate and the glass transition temperature (Tg) of the substrate only reaches 160° C.

SUMMARY OF THE INVENTION

The primary object of the present invention is to provide for a varnish. The varnish contains composite curing agent which has curing agent of polyphenylene methylphosphonate resin mixed with curing agent of phenol resin. The composite curing agent is provided for improving the reactivity of the phenolic resin so as to increasing Tg of the prepreg. Furthermore, the prepregs made by the varnish has characteristics of anti-flammability, heatproof, and low moisture absorption.

To achieve the above-mentioned objective, the present invention provides a varnish. The varnish includes composition (A): epoxy resin; and composition (B): composite curing agent, wherein the composite curing agent includes curing agent of polyphenylene methylphosphonate resin mixed with curing agent of phenol resin in a predetermined weight ratio.

The present invention provides a prepreg which is manufactured by dipping the glass fabrics into the varnish and then curing and drying the dipped fabrics.

The present invention further provides a substrate by laminating the prepreg into the substrate of PCB.

Two kinds of curing agent are mixed as a composite curing agent and the composite curing agent is added into a primary resin to form a halogen-free varnish. The prepregs are manufacturing by dipping glass fabrics into the varnish, and the reaction rate of curing is improved so that the problems of higher lamination pressure and longer lamination temperature of the substrate manufactured by traditional aldehyde resin are solved.

In order to further understand the techniques, means, and effects the present invention takes for achieving the prescribed objectives, the following detailed descriptions and appended drawings are hereby referred, such that, through which, the purposes, features, and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

The present invention provides a composite curing agent which is applied for a varnish. The varnish with the composite curing agent is used for dipping glass fiber and the curing rate is increased. Because of the higher curing rate, the reactivity of the phenolic resin and glass transition temperature (Tg) of the substrate made by the varnish are improved. The heatproof property and low moisture absorption property are not influenced by the composite curing agent. Furthermore, the prepreg made by the varnish has good anti-flammability. The problems of high laminated temperature and long laminated time period using traditional curing agent of aldehyde are solved. Moreover, fillers are added into the varnish for improving the high heatproof property and the anti-flammability.

The composite curing agent includes curing agent of polyphenylene methylphosphonate resin mixed with curing agent of phenol resin in a predetermined weight ratio. Ployphenylene methylphosphonate is provided as a curing agent for epoxy resin and it is shown by formula 1

Formula 1

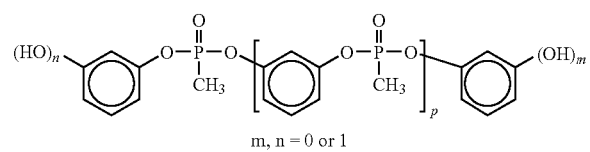

m, n = 0 or 1

Ployphenylene methylphosphonate is applied for improving the anti-flammability and the reactivity, therefore, ployphenylene methylphosphonate is mixed with curing agent of phenol resin as a composite curing agent of epoxy resin. The composite curing agent of epoxy resin results in the higher reactivity of varnish and higher Tg of substrate made by the varnish. Furthermore, the substrate made by the varnish has good heatproof property, anti-flammability, and low moisture absorption property.

The varnish of the present invention has composition (A): epoxy resin and composition (B): composite curing agent which contain curing agent of polyphenylene methylphosphonate resin and curing agent of phenol resin. The composition of the varnish is shown in Table. 1.

TABLE 1

| | comparison 1 | embodiment 1 | embodiment 2 | embodiment 3 | embodiment 4 | comparison 2 |
|---|---|---|---|---|---|---|
| A. epoxy resin | | | | | | |
| A1. phenolic epoxy resin (primary composition) | 100 | 100 | 100 | 100 | 100 | 100 |
| B1 curing agent of phosphoric ester resin (phr) | 0 | 9 | 18 | 27 | 2.5 | 0 |
| B2. curing agent of phenol resin | | | | | | |
| B21. curing agent of Bz resin (phr) | 104 | 99 | 94 | 89 | 65 | 65 |
| B22. curing agent of bisphenol A-novolac epoxy resin (phr) | | | | | 7.5 | 8.0 |
| moisture absorption test (PCT121° C./1 hr) | 0.281% | 0.284% | 0.284% | 0.287% | 0.267% | 0.253% |
| Float  1288° C.  min | 4~5 | 4~5 | 4~5 | 3~4 | 4~6 | >10 |
| Tg  DMA  ° C. | 160 | 185 | 195 | 205 | 180 | 160 |
| Td (5%)  TGA  ° C. | 375 | 379 | 381 | 382 | 387 | 384 |
| UL94  Grade | V-1 | V-1 | V-1 | V-0 | V-1 | V-1 |

As shown in Table. 1, the epoxy resin is the primary composition with 100 parts, the epoxy is two of or more than two of the o-cresol resol epoxy resin, bisphenol A-novolac epoxy resin, and novolac resin, but not restricted thereby. In other words, composition (A) is a phenolic resin. Alternatively, the composition (A) can be a non-phenolic resin. Embodiments 1-3 of Table. 1 adjusts the ratio of the curing agent of polyphenylene methylphosphonate resin and curing agent of phenol resin, and the prepregs made by the varnishes of the three embodiments are tested and analyzed.

The moisture absorption (i.e., water absorption) is determined by the water or moisture within the prepregs. The moisture absorption of the prepregs has to be controlled for preventing the situation of de-lamination. In general, the prepregs are inspected by infrared (IR) or thermogravimetric analysis so as to show the degree of moisture absorption.

The result of solder float resistance: the test follows the instruction of IPC-TM-650 Method 2.4.13.1. The method tests heat-dissipation prepregs in 288° C. and counts the time when the prepregs has failed (De-lamination). The results present that the de-lamination time of the prepreg meets the requirement of the heatproof property.

The test of anti-flammability follows the instruction of UL 94 method. According to the degree of the anti-flammability, the testing results are rated as HB, V-2, V-1, V-0, and 5V so as to represent the anti-flammability of prepregs. The testing prepreg is burned on the fire vertically and follows the following steps. Step 1 is burning the prepreg in fire for 10 seconds and then moving the prepreg away, and simultaneously counting the time period (T1) that the prepreg continues to burn after being removed from the fire. Step 2 is burning the prepreg in fire for 10 seconds again, then moving the prepreg away and simultaneously counting the time period (T2) that the prepreg continues to burn after being removed from the fire. Step 3 is repeating the steps 1 and 2, and calculating the mean value of T1 and T2. Step 4 is summing T1 and T2. According to the specific definition of UL 94, V-0, neither of the mean value of T1 and T2 is larger than 10 seconds, and the sum of T1 and T2 is no greater than 50 seconds. Therefore, the prepregs of examples 1, 2 and embodiment 1 having achieved the standard for V-0 are thus marked as UL 94, V-0.

In the embodiments 1-3, the curing agent of phenol resin of the composite curing agent is a Benzoxazine (Bz) resin. The Benzoxazine (Bz) resin has properties of low dielectric loss value, high elasticity, high heatproof, low moisture absorption, high Tg, high anti-flammability and capable of being punch pressed. The soft point of the Bz resin can be adjusted for improving the low toughness due to the straight chain of the resin and improving the de-lamination of laminated layers in the shaping step. Furthermore, the adhesion of the resin layers contacting with the inner electric circuits of the multi plates with conductive lines is improved so as to increase the strength of the inner layer.

According to the data in Table.1, the curing agent containing the curing agent of polyphenylene methylphosphonate resin of the embodiments 1-3 does not influence the moisture absorption and the heatproof of the manufactured substrates (comparing to the comparisons 1 and 2). With regard to the lamination process of FR4 (i.e., lamination temperature is above 195° C. and lamination time is above 30 minutes), the composite curing agent used in embodiments 1-3 can increase the reaction because the Tg of the substrate increases from 160° C. to 185° C. In other words, the problems of the higher lamination temperature and longer lamination time in the lamination process with the traditional curing agent are solved. The predetermined weight ratio of the curing agent of polyphenylene methylphosphonate resin and the curing agent of phenol resin of composition (B) is from 1:10 (as shown in embodiment 1) to 3:10 (as shown in embodiment 3). By using the composite curing agent containing the two curing agents, the Tg of substrate can be increased above 185° C., and can even reach more than 200° C.

In embodiment 4, the curing agent of phenol resin further contains a phenolic curing agent, for example a curing agent of bisphenol A phenol resin in the embodiment. Tg of the prepreg made from the varnish of embodiment 4 reaches to 180° C. and the reaction can be accelerated. On the other hand, the curing agent of phenol resin can be a phenolic curing agent.

Depending on the composition of embodiments 1-4 and the reasonable analysis, the curing agent of polyphenylene methylphosphonate resin of composition (B) has 2 to 30 parts by weight relative to 100 parts by weight of the composition (A), and the curing agent of phenol resin of composition (B) has 80 to 110 parts by weight relative to 100 parts by weight of the composition (A).

The varnish further has composition (C): filler and composition (D): solvent. The filler includes aluminium hydroxide, silica, or mixture of aluminium hydroxide and silica, and the composition (C) has 10 to 80 parts by weight relative to 100 parts by weight of the composition (A). On the other hand, the composition (D) has 10 to 30 parts by weight relative to 100 parts by weight of the composition (A). The preferred embodiment is shown in Table. 2. The varnish of the present invention further has at least one additive, such as an accelerator, and the accelerator is an isimidazole which is 0.4-1 parts shown in Table. 2. The isimidazole can be 2-Methyl Imidazole which is provided for accelerating the curing time. On the other hand, the solvent is 15-30 parts of one of or more than one of methyl ethyl ketone (MEK), propylene glycol monomethyl ether (PM), and cyclohexanone. Furthermore, the compositions are shown in Table. 2. The curing agent of polyphenylene methylphosphonate resin of composition (B) has 18 parts by weight relative to 100 parts by weight of the composition (A). The curing agent of phenol resin of composition (B) has 98 parts by weight relative to 100 parts by weight of the composition (A) and the curing agent of phenol resin can be curing agent of Bz resin (i.e., phenol resin with benzoxazine ring), phenolic curing agent, or the mixture of the curing agent of Bz resin and phenolic curing agent. The composition (C) has 30 parts by weight relative to 100 parts by weight of the composition (A) and the composition (C) can be aluminium hydroxide, silica, or mixture of aluminium hydroxide and silica. The composition (D) has 20 parts by weight relative to 100 parts by weight of the composition (A) and the composition (D) is one of or more than one of methyl ethyl ketone (MEK), propylene glycol monomethyl ether (PM), and cyclohexanone.

TABLE 2

| composition | chemical | | comment | parts | |
|---|---|---|---|---|---|
| epoxy resin | phenolic resin | o-cresol resol epoxy resin bisphenol A novolac epoxy resin novolac epoxy resin | choosing one or the mixture | primary parts | 100 |
| composite curing agent | curing agent of polyphenylene methylphosphonate resin | curing agent of polyphenylene methylphosphonate resin | anti-flammability, and accelerating reaction | relative parts | 18 |
| | curing agent of phenol resin | BZ resin phenolic curing agent | low moisture absorption and low curing reaction; choosing one or the mixture | relative parts | 98 |
| accelerator | | isimidazole compound | accelerating curing reaction | relative parts | 0.4 |
| filler | | aluminium hydroxide or silica | anti-flammability, heatproof and reducing cost | relative parts | 30 |
| solvent | | MEK, PM, cyclohexanone | choosing one or the mixture | relative parts | 20 |

A method for manufacturing a prepreg using the varnish are disclosed in the present invention. The varnish is provided and the varnish has composition (A): epoxy resin; and composition (B): composite curing agent, wherein the composite curing agent includes curing agent of polyphenylene methylphosphonate resin mixed with curing agent of phenol resin in a predetermined weight ratio. The varnish further has composition (C): filler which includes aluminium hydroxide, silica, or mixture of aluminium hydroxide and silica, and composition (D): solvent. The glass fabrics are dipped into the varnish so as to manufacture a prepreg, PP, or copper clad laminate (CCL) with good heatproof and anti-flammability properties. The above-mentioned prepregs are applied for manufacturing the substrate of PCB, and the substrate has improved reactivity in the lamination process.

In summary, the present invention has the following advantages.

1. Two kinds of curing agents (polyphenylene methylphosphonate resin and Bz resin) are mixed as a composite curing agent. The composite curing agent is distributed in the varnish so as to improve the anti-flammability, low moisture absorption, and heatproof property of prepreg which is made by dipping glass fabrics into the varnish. Furthermore, Tg of the substrate can be increased by using the varnish of the present invention.

2. The varnish of the present invention contain a composite curing agent with phosphor so that the anti-flammability of the prepreg is improved and the reaction rate of the curing is further increased.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A varnish, comprising:
   composition (A): epoxy resin; and
   composition (B): composite curing agent, wherein the composite curing agent includes curing agent of polyphenylene methylphosphonate resin mixed with curing agent of phenol resin in a predetermined weight ratio.

2. The varnish according to claim 1, wherein the epoxy resin is a phenolic resin.

3. The varnish according to claim 2, wherein the phenolic resin is one of, two of, or more than two of o-cresol resol epoxy resin, bisphenol A-novolac epoxy resin, and novolac resin.

4. The varnish according to claim 1, wherein the curing agent of polyphenylene methylphosphonate resin of composition (B) has 2 to 30 parts by weight relative to 100 parts by weight of the composition (A).

5. The varnish according to claim 4, wherein the curing agent of polyphenylene methylphosphonate resin of composition (B) has 18 parts by weight relative to 100 parts by weight of the composition (A).

6. The varnish according to claim 5, wherein the curing agent of phenol resin of composition (B) has 80 to 110 parts by weight relative to 100 parts by weight of the composition (A).

7. The varnish according to claim 6, wherein the curing agent of phenol resin of composition (B) has 98 parts by weight relative to 100 parts by weight of the composition (A).

8. The varnish according to claim 1, wherein the predetermined weight ratio of the curing agent of polyphenylene methylphosphonate resin and the curing agent of phenol resin of composition (B) is from 1:10 to 3:10.

9. The varnish according to claim 8, wherein the curing agent of phenol resin is a curing agent of phenol resin with benzoxazine ring, a phenolic curing agent, or a mixture of a curing agent of phenol resin with benzoxazine ring and a phenolic curing agent.

10. The varnish according to claim 9, wherein the phenolic curing agent is a curing agent of bisphenol A phenol resin.

11. The varnish according to claim 1, further comprising composition (C): filler, wherein the filler includes aluminium hydroxide, silica, or mixture of aluminium hydroxide and silica, composition (C) has 10 to 80 parts by weight relative to 100 parts by weight of the composition (A).

12. The varnish according to claim 11, wherein the composition (C) has 30 parts by weight relative to 100 parts by weight of the composition (A).

13. The varnish according to claim 1, wherein composition (D) includes one of or more than one of methyl ethyl ketone, propylene glycol monomethyl ether, and cyclohexanone.

14. The varnish according to claim 1, wherein composition (D) has 20 parts by weight relative to 100 parts by weight of the composition (A).

15. A prepreg being manufactured by dipping glass fabrics into the varnish of claim 1.

16. A substrate of printed circuit board being manufactured by laminating the prepreg of claim 15.

* * * * *